(12) United States Patent
Taft et al.

(10) Patent No.: US 7,030,824 B1
(45) Date of Patent: Apr. 18, 2006

(54) MEMS REFLECTARRAY ANTENNA FOR SATELLITE APPLICATIONS

(75) Inventors: William Joseph Taft, Yardville, NJ (US); Allen Katz, West Windsor, NJ (US); George Arthur Silverman, Bensalem, PA (US); Wing Joseph SooHoo, Springfield, PA (US); Anthony Jacomb-Hood, Yardley, PA (US); Gerard Joseph Matyas, Bala Cynwyd, PA (US)

(73) Assignee: Lockheed Martin Corporation, Bethesda, MD (US)

( * ) Notice: Subject to any disclaimer, the term of this patent is extended or adjusted under 35 U.S.C. 154(b) by 51 days.

(21) Appl. No.: 10/448,265

(22) Filed: May 29, 2003

(51) Int. Cl.
*H01Q 13/10* (2006.01)
*H01Q 3/22* (2006.01)

(52) U.S. Cl. ...................... 343/767; 342/368

(58) Field of Classification Search .............. 343/853, 343/897, 770, 771, 700 MS, 767, 872; 342/128, 342/368, 394, 406
See application file for complete search history.

(56) References Cited

U.S. PATENT DOCUMENTS

| 6,081,235 | A | 6/2000 | Romanofsky et al. |
| 6,351,247 | B1 | 2/2002 | Linstrom et al. |
| 6,384,473 | B1 | 5/2002 | Peterson et al. |
| 6,396,449 | B1 | 5/2002 | Osterhues et al. |
| 6,470,545 | B1 | 10/2002 | Branchevsky |
| 6,653,985 | B1 * | 11/2003 | Sikina et al. ............... 343/853 |
| 6,741,207 | B1 * | 5/2004 | Allison et al. .............. 342/371 |
| 6,759,980 | B1 * | 7/2004 | Chen et al. ................. 342/372 |
| 6,801,160 | B1 * | 10/2004 | Henderson et al. ......... 342/373 |
| 6,822,615 | B1 * | 11/2004 | Quan et al. ................. 343/754 |

OTHER PUBLICATIONS

Hill, Roger "Tutorial: A Practical Guide to The Design of Microstrip Antenna Arrays" at [http:www/navicpmart.com/advice/advicetmp.cfms/B8AA82E46B035537E034080020B4...], printed May 9, 2003, 13 pages.

Holzwarth, S. et al. "Planar Antenna Arrays on LTTC-Multilayer Technology", *ICAP: 11th International Conference on Antennas and Propagation*, Apr. 2001, pp. 710-714, Manchester.

* cited by examiner

*Primary Examiner*—Shih-Chao Chen
*Assistant Examiner*—Minh Dieu A
(74) *Attorney, Agent, or Firm*—McDermott Will & Emery LLP (57) ABSTRACT

Methods and apparatus provide vibration-free steered-beam antennas using a module to accommodate segregated de and rf signals. A phase-shifter element is disposed within an interior of the module. A radiating element is provided, and an rf interface is adapted to couple energy between the phase-shifter element and the radiating element. The rf interface is disposed entirely within the interior of the module and is adapted to provide an rf interface with the module substantially only through the radiating element. A dc interface is adapted to couple energy between the phase-shifter element and an electrical connection element disposed exterior to the module.

27 Claims, 8 Drawing Sheets

MEMS REFLECTARRAY ANTENNA FOR SATELLITE APPLICATIONS

BACKGROUND OF THE INVENTION

This application relates generally to antennas. More specifically, this application relates to reflectarray antenna systems.

The use of antennas in space, such as on satellites or spacecraft, presents challenges beyond those encountered in the terrestrial use of antennas. In particular, the need to locate antennas in space makes the processes for both the manufacture and use of such antennas much more sensitive to cost, mass, efficiency, stowability, deployment, and other considerations than is true for their terrestrial counterparts. In many respects, these heightened concerns have limited the way in which technology that is very suitable for terrestrial applications may be extended to space applications.

One specific application in which this is evident is in the use of electronically steered antennas, in which an electromagnetic beam is steered by using electronic phase shifters on a physically flat reflector, rather than by using physically shaped reflectors. One advantage to the use of such antennas is that the steering characteristics may conveniently be adjusted electronically rather than requiring physical adjustments. This could have significant advantages in space applications where reduction in vibrations that otherwise result from physical adjustments could be avoided. This is especially true, for example, given the large scan-angle ($>\pm60°$) applications used in some satellite applications. While such electronically steered antennas have found significant terrestrial applications, their use in space applications has been hampered by efficiency and other considerations. In particular, electronic phase-shifter components often have insertion losses that may be acceptable for terrestrial applications, but which are too large for space applications. The large insertion losses associated with the phase shifters result in increased output power required of the transmitter, thereby generally increasing cost, power-supply requirements, and thermal management resulting from the increased need for power dissipation. In addition, such electronic phase-shifter components also require radio-frequency ("rf") electrical connections, which add complexity to the design and decrease reliability.

There is, accordingly, a general need in the art for improved antenna and antenna-component designs that mitigate such factors so that they may be more readily used in space applications.

BRIEF SUMMARY OF THE INVENTION

Embodiments of the invention provide methods and apparatus that may be used to provide vibration-free steered-beam antennas, providing in particular for segregation of direct-current ("dc") and rf signals. In one set of embodiments, a module is provided, such as may be appropriate for use as part of a reflectarray antenna. A phase-shifter element is disposed within an interior of the module. A radiating element is provided, and an rf interface is adapted to couple energy between the phase-shifter element and the radiating element. The rf interface is disposed entirely within the interior of the module and is adapted to provide an rf interface with the module substantially only through the radiating element. A dc interface is adapted to couple energy between the phase-shifter element and an electrical connection element disposed exterior to the module. A purpose of the dc connection may be to provide power and/or control to the phase-shifter element.

In one embodiment, the module is provided with a tile-like configuration and supports an array of radiating elements. In such an embodiment, the phase-shifter element comprises a plurality of phase-shifter elements that define a device plane. The radiating element comprises an array of radiating elements positioned to interact with an electromagnetic beam propagating substantially orthogonally to the device plane.

The phase-shifter element may comprise a MEMS phase-shifter element in some embodiments. Also, the phase-shifter element may comprise a series reflection phase-shifter element, a parallel reflection phase-shifter element, or a hybrid reflection phase shifter element that comprises a transmission phase-shifter element serially coupled with a reflection phase-shifter element. In some instances, a cover may be to disposed to seal a cavity within the interior of the module in which the phase shifter element is disposed. In some embodiments, the antenna may use a microstrip-circuitry arrangement. A metallized ground plane is disposed within the interior of the module between the radiating element and the phase-shifter element. The rf interface may then comprise a metallized rf matching line electrically coupled with the phase-shifter element and a coupling slot in the metallized ground plane through which energy may be coupled with the radiating element. The metallized rf matching line may extend a length beyond the coupling slot substantially equal to $\lambda_g/4$, where $\lambda_g$ is a guide wavelength of a waveguide that includes the coupling slot. In other embodiments, the rf interface may comprise a metallized rf transmission line electrically coupled with the phase-shifter element and a metallized via disposed to provide a metallic connection through the metallized ground plane to the metallized rf transmission line and to the radiating element. The module may be a layered structure in which a first dielectric layer is disposed between the radiating element and the ground plane, and in which a second dielectric layer is disposed between the ground plane and the metallized rf matching line.

The module may also be adapted for electrical coupling with an external element using only dc energy. For example, a ball grid array may be coupled with the dc interface to provide such electrical coupling. In one such embodiment, the dc interface comprises a metallized dc bias line electrically coupled with the phase-shifter element. A metallized via stack through a dielectric stack within the interior of the module connects the metallized dc bias line with a ball of the ball grid array.

In a second set of embodiments, a method is provided for manufacturing a reflectarray antenna. A radiating element is disposed over a first surface of a first dielectric layer and a MEMS phase-shifter element is disposed over a second surface of the first dielectric layer. An rf interface adapted to couple energy between the MEMS phase-shifter element and the radiating element is formed to provide an rf interface with the module substantially only through the radiating element. Similarly, a dc interface adapted to couple energy between the MEMS phase-shifter element and an exterior to the module is formed. The MEMS phase-shifter element is sealed within an interior of the module.

In some instances, a plurality of MEMS phase-shifter elements may be disposed over the second surface of the first dielectric layer to define a device plane. An array of radiating elements is disposed over the first surface of the dielectric layer and positioned to interact with an electromagnetic beam propagating substantially orthogonally to the device plane.

In some embodiments, a metallized ground plane may be formed over the second surface of the first dielectric layer, with the MEMS phase-shifter element disposed over the metallized ground plane. The MEMS phase-shifter element may then be disposed by disposing a second dielectric layer over the metallized ground plane, with a gap in the second dielectric layer within which the MEMS phase-shifter element is positioned. The rf interface may be formed by forming a coupling slot in the metallized ground plane and forming a metallized rf matching line over a surface of the second dielectric layer opposite the metallized ground plane, both electrically coupled with the MEMS phase-shifter element and electromagnetically coupled with the radiating element through the coupling slot. In other instances, the rf interface may be formed by forming a metallized rf transmission line over a surface of the second dielectric layer opposite the metallized ground plane and electrically coupled with the MEMS phase-shifter element and by forming a metallized via to provide a metallic connection through the metallized ground plane to the metallized rf transmission line and to the radiating element. Similarly, the dc interface may be formed by forming a metallized dc bias line over a surface of the second dielectric layer opposite the metallized ground plane and electrically coupled with the MEMS phase-shifter element. A third dielectric layer comprising a metallized via may then be disposed over the metallized dc bias line so that an electrical connection to the metallized via may be formed over the third dielectric layer exterior to the module. Each of the dielectric layers may comprise powdered ceramic mixed with a binder, in which case the method may further comprise sintering the module to remove the binder.

In a third set of embodiments, a reflectarray antenna is provided. A plane reflector of the reflectarray antenna comprises a plurality of antenna module elements and a feed antenna disposed and adapted to illuminate the plane reflector. Each antenna module element comprises a radiating element, an internal phase-shifter element, and an external interface. The internal phase-shifter element is interfaced with the radiating element to couple rf energy to the radiating element such that an rf interface is provided with the each such antenna module element substantially only through the radiating element. The external interface comprises a dc interface and couples energy with the internal phase-shifter element.

In some such embodiments, the plane reflector may further comprise a back plane having a control distribution network, and the dc interface for each antenna module element may comprise a ball grid array mounted to the back plane. In some instances, the internal phase-shifter element for each antenna module element comprises a MEMS phase-shifter element sealed internal to the antenna module element.

In a fourth set of embodiments, a method is provided for steering an electromagnetic signal. A plane reflector comprising a plurality of antenna module elements is illuminated with the electromagnetic signal. RF energy is coupled from the electromagnetic signal incident at each of the antenna module elements to a phase-shifter element internal to each such antenna module element substantially only through a radiating element comprised by each of the antenna module elements. Energy is provided to the phase-shifter element for each antenna module element with a dc interface external to the phase-shifter element. The electromagnetic signal is re-radiated from each of the antenna module elements with a phase delay introduced selectively with the phase-shifter element to steer the electromagnetic signal.

The method may correspond to transmitting or to receiving the electromagnetic signal. In one embodiment, for example, the plane reflector is illuminated from a feed antenna so that steering the electromagnetic signal corresponds to transmitting the electromagnetic signal. In another embodiment, the plane reflector is illuminated from a remote source and the electromagnetic signal is focused onto a feed antenna so that steering the electromagnetic signal corresponds to receiving the electromagnetic signal.

In some instances, the phase-shifter element may comprise a MEMS phase-shifter element. The rf energy may be coupled through a slot in a ground plane disposed within each antenna module element to an rf matching line electrically coupled with the phase-shifter element. Alternatively, rf energy may be coupled through a metallic connection from the radiating element to an rf transmission line electrically coupled with the phase-shifter element. Energy may be provided to the phase-shifter element by electrically coupling the dc interface with a dc bias line electrically coupled with the phase-shifter element through a metallized via stack in a dielectric stack.

In a fifth set of embodiments, a hybrid reflection phase shifter is provided. An rf port is provided, as is a transmission phase shifter having a first interface and a second interface, with the first interface coupled with the rf port. A reflection phase shifter is coupled with the second interface. In some instances, the transmission phase shifter may comprise a plurality of serially interfaced transmission phase bits adapted to provide distinct phase shifts. In other instances, the transmission phase shifter may comprise a transmission analog phase shifter. The reflection phase shifter may comprise a series reflection phase shifter or could comprise a parallel reflection phase shifter.

BRIEF DESCRIPTION OF THE DRAWINGS

A further understanding of the nature and advantages of the present invention may be realized by reference to the remaining portions of the specification and the drawings wherein like reference numerals are used throughout the several drawings to refer to similar components. In some instances, a sublabel is associated with a reference numeral and follows a hyphen to denote one of multiple similar components. When reference is made to a reference numeral without specification to an existing sublabel, it is intended to refer to all such multiple similar components.

DETAILED DESCRIPTION OF THE INVENTION

Embodiments of the invention provide a reliable, low-cost, vibration-free steered-beam antenna suitable for use in space applications, such as on satellites. Such characteristics are achieved in part by using a packaging approach that eliminates rf electrical connections, using a free-space rf interconnection approach. Essentially, the packaging approach described herein permits a distinct separation to be drawn between the rf coupling, which is accommodated internal to an antenna module element, and dc connections, which are used to provide bias as necessary to phase-shifter elements incorporated within the antenna module element. In addition, embodiments of the invention make use of phase-shifter elements based on microelectromechanical-systems ("MEMS") devices. The electromechanical nature of such MEMS phase-shifter elements results in lower insertion losses when compared with conventional solid-state phase shifters. While ferrite phase shifters may provide low loss similar to MEMS phase shifters, they are heavier and more expensive. Also, the combination of elements embodied by the invention permits a reflectarray to be provided with low cost and light weight. There is no rf distribution network and the control distribution network may be implemented with a back plane that comprises a low-cost/light-weight multilayer printed circuit board or flex substrate.

MEMS phase-shifter elements tend to be more fragile than conventional solid-state devices and to require higher bias. The packaging approach described herein provides, simultaneous with the segregation between rf and dc interfaces, sufficient protective packaging not only to accommodate the fragility of MEMS structures, but also for their implementation in a space environment. The packaging of the MEMS phase-shifter elements results in reduced manufacturing cost, mass, and required dc power, with improved stowability and deployment of the antennas. In addition, the packaging provides good scalability, thereby providing a structure that is versatile and flexible.

Figure 1A:
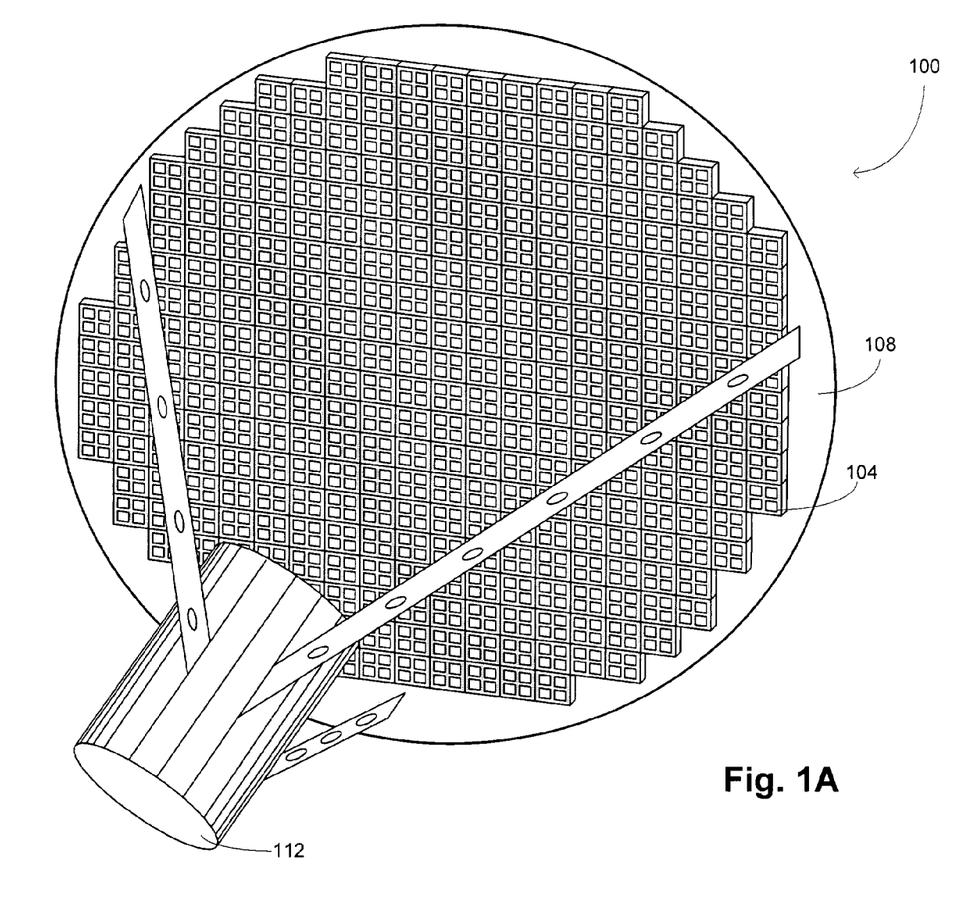
FIG. 1A provides a perspective illustration of a reflectarray antenna made in accordance with an embodiment of the invention.

A perspective view of a reflectarray antenna made in accordance with an embodiment of the invention is shown in FIG. 1A. The antenna 100 comprises a substantially planar back plane 108 having a control-signal distribution network over which a plurality of antenna module elements 104 are affixed so that they may be reached with electromagnetic signals propagated from a feed antenna 112. Each of the antenna module elements 104 includes one or more radiating elements, so that the collection of antenna module elements 104 defines a reflector array having a plurality of radiating elements. The illustrated embodiment conveniently uses four radiating elements with each module element 104, but different numbers may be used in other embodiments and perhaps depending on the specific application. Furthermore, there is no requirement that each of the module elements 104 comprise the same number of radiating elements. Generally, the radiating elements may comprise any suitable elements, such as dipoles, slot radiators, helices, microstrip patches, ortholinear polarization elements, and the like. The specific selection of patch-antenna types and their relative placement may be varied to meet particular design or application criteria.

Figure 1B:
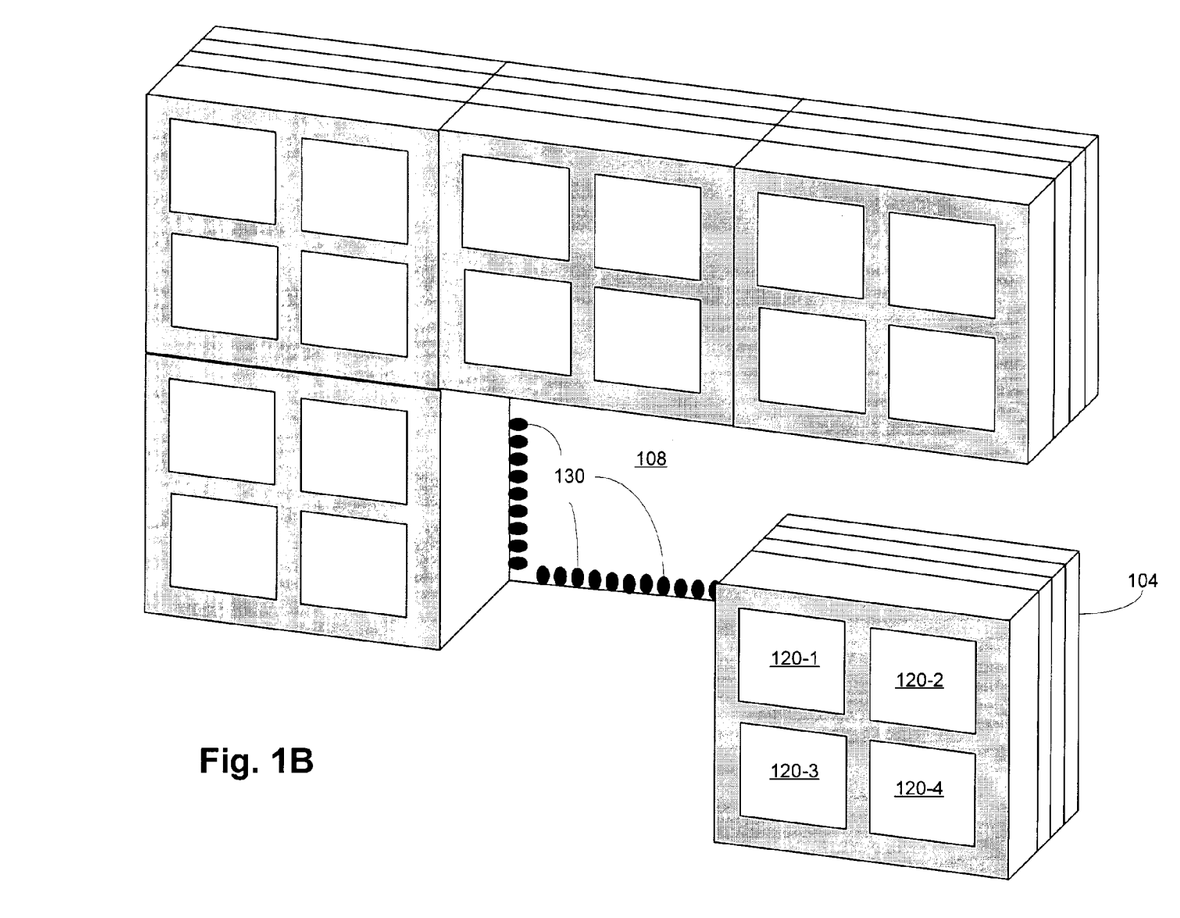
FIG. 1B provides a enlarged perspective view of the antenna module elements used in the reflectarray antenna shown in FIG. 1A.

An expanded view of a small number of the antenna module elements 104 is shown in FIG. 1B, with the radiating elements 120 more easily visible. In this view, one of the module elements 104 has been displaced to illustrate that an arrangement of electrically conductive mounts 130 on back plate 108 permits interfacing with a ball-grid array comprised by each of the module elements 104. Such a mounting arrangement provides an effective, low-cost mechanism both for physical mounting of the module elements 104 and for bias injection to control electronic operation of the module elements 104. Bias injection provided by a control-signal distribution network that may be comprised by the back plane of the antenna. Also visible in FIG. 1B is the fact that in some embodiments the individual antenna module elements 104 may have a layered structure, which, as described in greater detail below, may result from a manufacturing process that uses a low-temperature co-fired ceramic ("LTCC") technique, although other manufacturing techniques may alternatively be used.

Figure 2A:
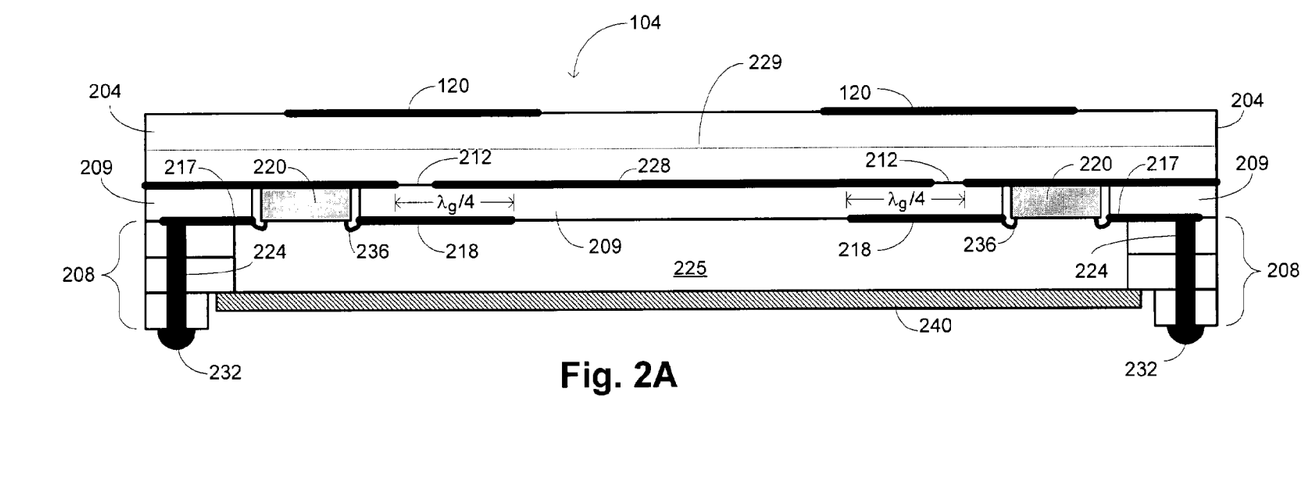
FIG. 2A provides a cross-sectional view of one of the antenna module elements used in the reflectarray antenna shown in FIG. 1A for a patch-antenna radiating element.

The basic structure of an individual antenna module element 104 is shown in an embodiment using a patch-antenna radiating element with the cross-sectional view of FIG. 2A. With this view, the multilayered character of the module is evident. The individual layers typically comprise layers of dielectric material and metallization layers that are used to house a phase-shifter element 220 and to provide an internal rf interface and an external dc interface. This cross-sectional view corresponds to the module element 104 having four rectangularly distributed radiating elements 120, and therefore two of those radiating elements 120 are visible at the top of the structure. Associated with each of the radiating elements 120 is a phase-shifter element 220 so that the phase shift associated with each radiating element 120 may be controlled individually.

The phase shifters 220 are disposed within an interior of the module 104. Such an arrangement is advantageous since, as previously noted, the phase shifters 220 may comprise MEMS phase-shifter elements in some embodiments. The specific characteristics of the phase shifter may depend on the antenna application since different types of phase shifters may have different effects on such characteristics as the magnitude of signal side lobes that are produced in the reflected electromagnetic signal. For example, MEMS phase shifters are examples of digital phase shifters, which have the advantage of being insensitive to noise on their bias control lines. Such digital phase shifters provide a discrete set of phase states that are controlled by two-state switching devices. A binary structure is sometimes implemented so that the nth bit corresponds to potential phase shifts of $360°/2^n$. Thus, in a three-bit phase shifter, for example, the least significant bit would correspond to a 45° bit. In a six-bit phase shifter, the least significant bit would correspond to a 5.6° bit. The number of such phase bits used may depend on the intended application, with 2–6 phase bits being commonly suitable for many space applications. There are a number of ways to implement the phase shifts for each of the phase bits, examples of which are discussed in detail in connection with FIGS. 3A–3G.

Regardless of the specific type of phase shifters 220 that may be used, each phase shifter 220 may be electrically coupled with the rf and dc interfaces. For example, using a microstrip-circuitry configuration, a conducting ground plane 228 may be disposed within the interior of the module 104 between the phase-shifter element 220 and the radiating element 120 in the form of a metallized layer. In the embodiment shown in FIG. 2A, the rf interface between the phase shifter and the radiating element may be provided by electromagnetic coupling. In particular, rf energy is coupled from a metallized rf matching line 218 through a coupling slot 212 in the conducting ground plane 228 to the radiating element. The rf matching line 218 is electrically coupled with the phase-shifter element 220, such as with a wirebond 236 or similar type of electrical coupling. In order to couple the rf energy to the radiating element 120, a quarter-wavelength geometry may be used to minimize losses by having the rf matching line 218 extend a length substantially equal to $\mu_g/4$ beyond the coupling slot 212. In this instance $\lambda_g$ corresponds to a guide wavelength of the waveguide arrangement, corrected for the effective dielectric constant $K_{eff}$ of the transmission line 218. In particular, according to the manufacturing methods described below, the transmission line 218 may comprise a dielectric such as $Al_2O_3$ formed as second dielectric layers 209. Line 229 within dielectric layer 204 illustrates that this layer may comprise multiple sublayers provided according to a manufacturing process, an example of which is described below. The effective dielectric constant $K_{eff}$ depends on the dielectric constant of the material and the physical dimensions of the system, with the guide wavelength being $\lambda_g=\lambda_0 K_{eff}^{-0.5}$ for a free-space wavelength $\lambda_0$. Optimization of the module 104 may thus minimize unwanted mismatches between the radiating elements 120, coupling structure, and phase-shifter elements 220.

The dc interface may be provided with a dc bias line 217 electrically coupled with the phase-shifter element 220, also such as with a wirebond 236 or similar type of electrical coupling. In the illustrated embodiment, the dc bias line 217 is conveniently provided on the same layer level as the rf matching line 218, although this is not required and could be provided on a different layer level in other embodiments. Coupling with the exterior of the module 104 may be achieved with a metallized via stack 224 formed through a dielectric stack 208. In an advantageous embodiment, such an arrangement permits the dc interface to couple the phase-shifter element 220 with an external mounting arrangement, such as a solder ball-grid array ("BGA") having a plurality of solder balls 232. This arrangement provides a convenient mechanism for bias injection to the phase-shifter element 220 through the solder balls 232, while simultaneously providing a convenient mounting mechanism for the module 104. The BGA may be used to mount the module 104 on the back plane 108 of an antenna using the conductive mounts described in connection with FIG. 1B. It will thus be appreciated that the structure of the dc and rf interfaces with the phase-shifter elements 220 segregates the two so that the only physical connections needed external to the module 104 are the dc connections.

In the embodiment shown in FIG. 2A, the dielectric stack 208 that includes the metallized via 224 is shown as a built-up stack, such as may be formed using a plurality of dielectric levels in a manufacturing process. Such a stack allows a cavity 225 to be defined within the interior of the module 104 when the stack 208 is formed only narrowly along a perimeter of the module 104. Such a cavity 225 may be sealed by including a cover 240, which may be affixed to the dielectric stack 208 within a recessed portion of the stack. The cover 240 acts to protect the interior phase-shifter elements 220, and may provide sufficient protection even where the module is deployed in a space environment and the phase-shifter elements 220 comprise MEMS phase-shifter elements.

Figure 2B:
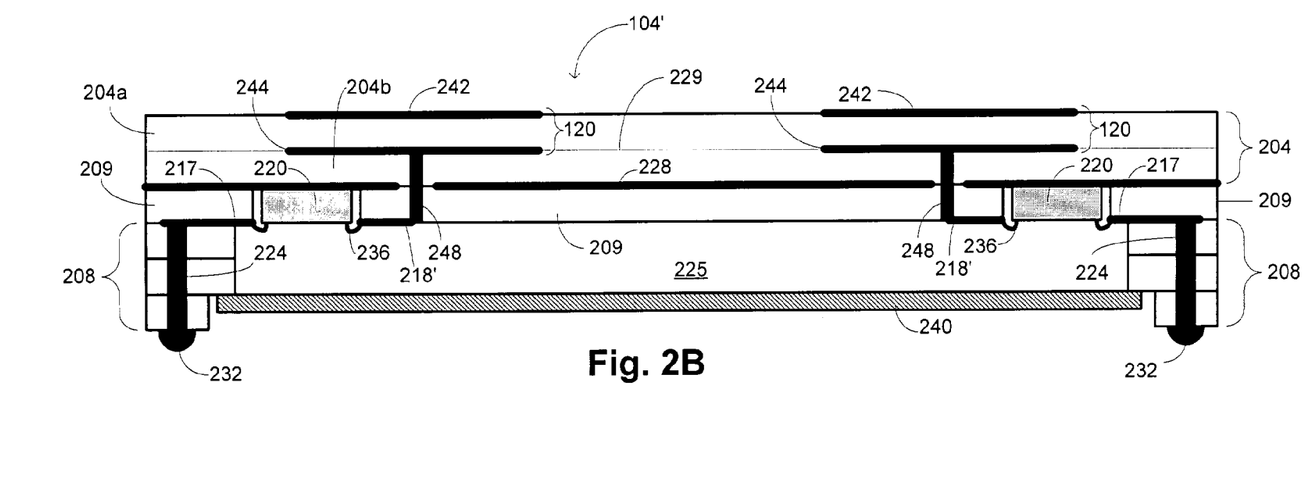
FIG. 2B provides a cross-sectional view of one of the antenna module elements used in the reflectarray antenna shown in FIG. 1A for a stacked-patch-antenna radiating element.

FIG. 2B illustrates an alternative embodiment in which the radiating elements 120 comprise stacked patch elements. The basic structure of the module 104' is similar, although the stacked nature of the radiating elements 120 is shown with a driver patch 244 and a parasitic patch 242, and layer 204 is shown explicitly as comprising layers 204a and 204b. Also, each driver patch 244 is shown to be coupled electrically with a respective phase-shifter element 220 through a metallized via 248 that extends through dielectric layers 204b and 209 and through an rf transmission line 218'. Such a metallized via 248 could alternatively be used to couple the phase-shifter elements 220 with the radiating elements 120 for the patch antennas shown in FIG. 2A. While the stacked patch elements are shown in FIG. 2B having two patches, they may comprise a different number of patches in other embodiments. The use of a stacked patch arrangement may provide a broader bandwidth than does use of a single-patch antenna element and permits staggered tuning. Thus, the specific determination of which configuration of the module to use may depend on the intended application for the reflectarray antenna in which they are to be used.

Furthermore, the invention is not limited to patch-antenna and stack-patched-antenna arrangements for the radiating elements 120, although those arrangements have the advantage that they may be easily printed, such as described in connection with the exemplary manufacturing process discussed below. There are a variety of other types of radiating elements that may be accommodated, and FIGS. 2A and 2B conveniently illustrate the different types of rf coupling that may be used in connection with different types of radiating elements. For example, helix and dipole radiating elements may use a metallic connection such as illustrated with the via 248 shown in FIG. 2B. A slot element may use a feed line similar to that described in connection with the patch element of FIG. 2A, but with it placed on the opposite side of the ground plane 228, and therefore with a metallized via feed through the ground plane 228.

A common aspect of each of these arrangements is that the only rf interface with the phase-shifter elements 220 is provided through the radiating elements, which is used both as the rf input and rf output to the module. Also, the module arrangements described herein are "tile-like" arrangements in which a two-dimensional array of radiating elements is supported, and in which the electromagnetic beam is substantially orthogonal to a plane that contains the operating electronics, i.e. that contains the distribution of a plurality of phase-shifter elements that correspond to the two-dimensional array of radiating elements. Such an arrangement may be contrasted with a "brick-like" arrangement in which the electromagnetic beam would instead be substantially parallel to the plane that contains the operating electronics.

It will be evident to those of skill in the art that a variety of different materials may be used for the different layers provided in the structures of FIGS. 2A and 2B, and that different manufacturing processes may be used. Merely by way of example, the dielectric layers 204, 209, and 208 could comprise alumina $Al_2O_3$, the metallization layers for the grounding plane 228, de bias lines 217, and vias 224 and 248 could comprise a Au—Pt alloy, and the cover 240 could comprise a Au-plated kovar material. In instances where the cover 240 is to be sealed hermetically, it may be affixed to the module 104 with a solder seal; in other instances, the cover 240 may by affixed to the module 104 using an epoxy. In one embodiment, the rf matching lines 218 comprise a network of a Ti—W—Au alloy having a thickness on the order of tens of μm.

Figure 3A:
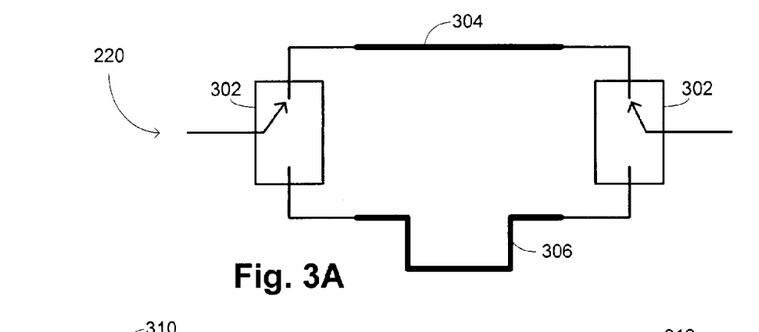
FIG. 3A provides a schematic illustration of the implementation of a phase bit in a transmission phase shifter.

A variety of examples of phase-shifter arrangements that may be used in embodiments of the invention are illustrated with FIGS. 3A–3G. A simplified example of a principle on which a phase shifter may operate is shown in FIG. 3A. This example may be considered to illustrate the function of a one-bit phase shifter or may be considered to illustrate the implementation of one phase bit of a phase shifter comprising multiple phase bits. The illustrated implementation is of a switched-line phase shifter, although many other configurations will also be known to those of skill in the art, including, for example, implementations that include high-pass and low-pass topologies, loaded-line phase shifters, quadrature phase shifters, and the like. In the simple case of a switched-line phase shifter, switches 302 are provided to direct signals along either a reference arm 304 or a delay arm 306, with the phase shift being defined by the difference in electrical lengths of the reference and delay arms 304 and 306. In the case of MEMS phase shifters, the switches 302 comprise microelectromechanical switches.

Figures 3B, 3C:
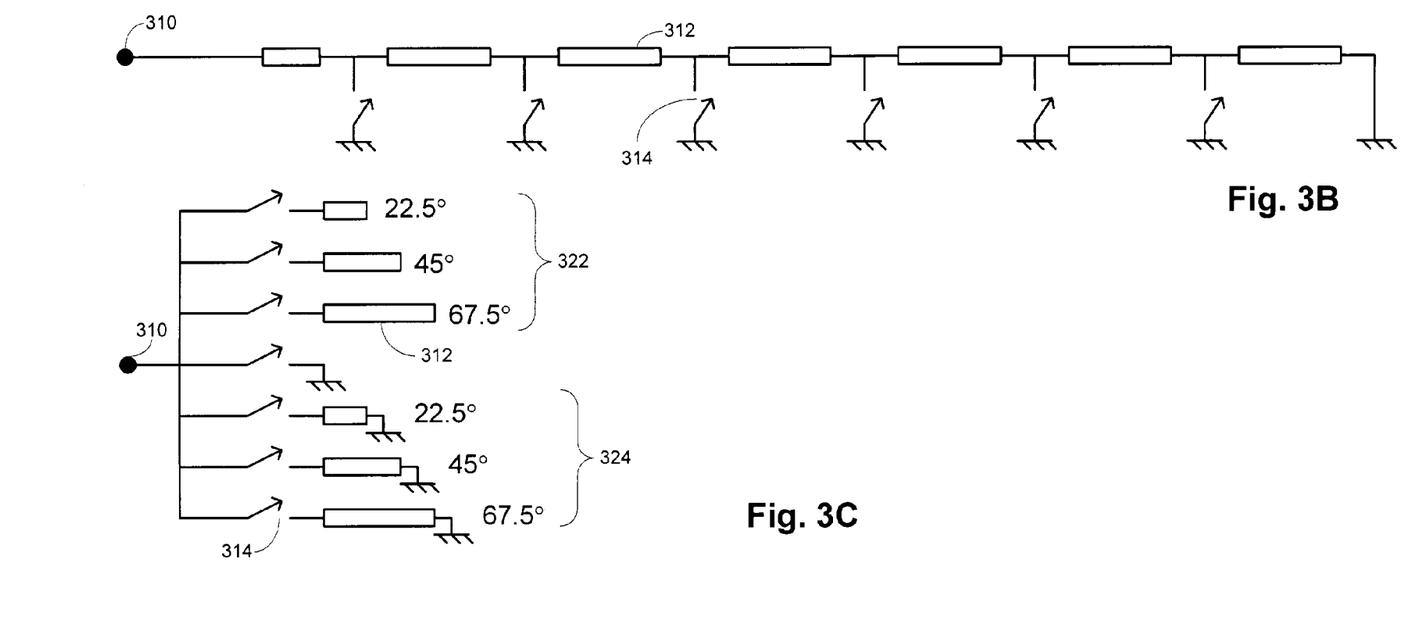
FIGS. 3B and 3C provide schematic illustrations of reflection phase shifters.
Figure 3D:
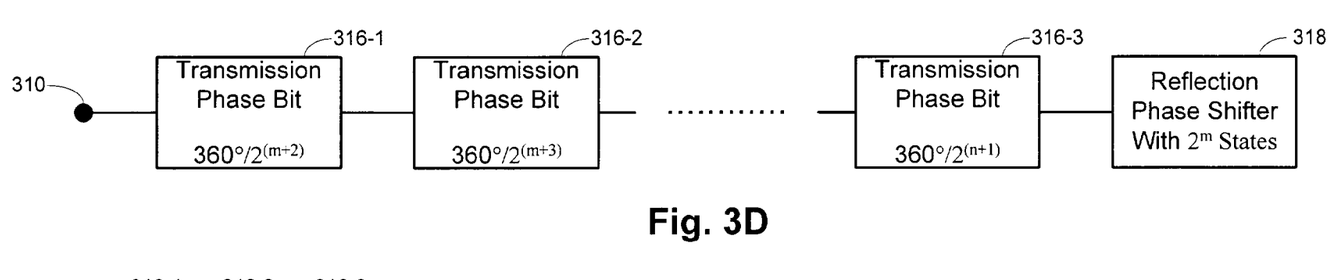
FIGS. 3D and 3E provide schematic illustrations of hybrid reflection phase shifters using digital phase-shift elements.

The example of FIG. 3A is an illustration of a transmission phase shifter, although a reflection phase shifter may more often be used in the reflectarray applications embodied by the invention. Generally, for applications that use relatively coarse phase control, i.e. with about 2–4 phase bits, reflection phase shifters have lower loss and are less complex than transmission phase shifters. Two types of reflection phase shifters are illustrated in FIGS. 3B and 3C. Each of the reflection phase shifters makes use of a plurality of transmission-line elements 312 coupled with an rf port 310 and respective switches 314. In FIG. 3B, the reflection phase shifter is configured as a series reflection phase shifter. In this case, the signal enters at the rf port 310 and propagates along the transmission-line elements 312 until it reaches the first switch 314 along the transmission path that is "on." The switch 314 provides a short circuit and reflects substantially all of the rf signal back towards the rf port 310. The reflection phase is determined by twice the length of transmission line between the rf port 310 and the switch in the on state. The highest phase-shift state may be provided by a fixed short circuit at the end of the transmission line. The total number of available phase states is thus one more than the number of switching devices.

In FIG. 3C, the reflection phase shifter is configured as a parallel reflection phase shifter. This phase shifter may typically be operated with zero or one of the switches 314 in the on state, with all other switches in the "off" state. In the case where one switch 314 is in the on state, the rf signal enters at the rf port 310 and propagates along the transmission-line element 312 connected with this port 310 by the on switch. At the end of the transmission-line element 312, a highly reflective load is provided. For the example shown in FIG. 3C, this comprises either an open circuit as for transmission-line elements 322 or a short circuit as for transmission-line elements 324, although any other reactive load could be used. This load reflects substantially all of the rf signal back towards the rf port 310. The reflection phase is the sum of twice the length of the transmission line and the reflection phase of the load. The reflection phase of a short circuit is 180° different from that provided by an open circuit. For the example shown in FIG. 3C, then, each of the three transmission lines 324 that end in a short circuit provide phase shifts that differ by 180° than the corresponding one of the three transmission lines 322 that end in an open circuit. The electrical lengths of the transmission-line elements 312 are noted in the figure with the corresponding transmission-line phase shift. In addition, one switch connects directly to a short circuit to provide a 0° phase shift; a corresponding open-circuit termination may be provided when all of the switches 314 are in the off state to provide a 180° phase shift. Thus, the configuration shown in FIG. 3C provides eight distinct phase states with nominal phase shifts of 0°, 45°, 90°, 135°, 180°, 225°, 270°, and 315°. More generally, the total number of available phase states for the parallel reflection phase shifter is one more than the number of switching devices.

Figure 3E:
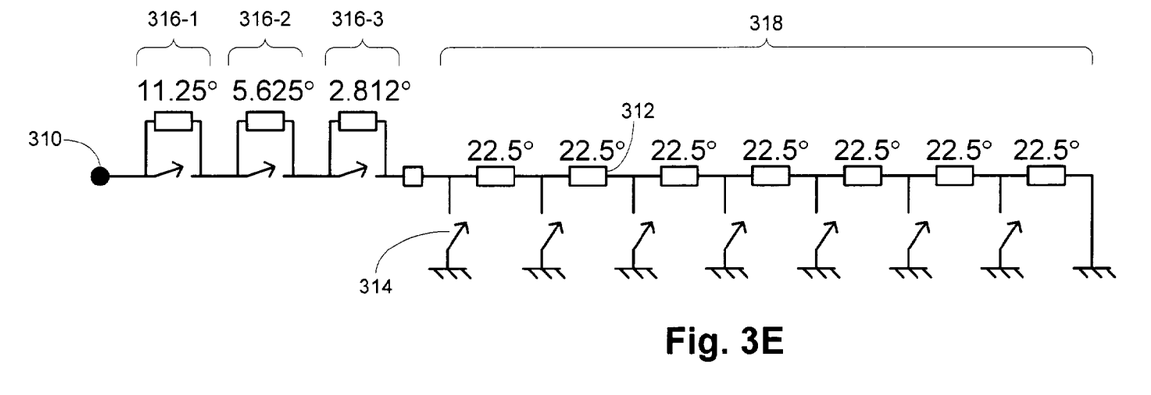
Figure 3F:
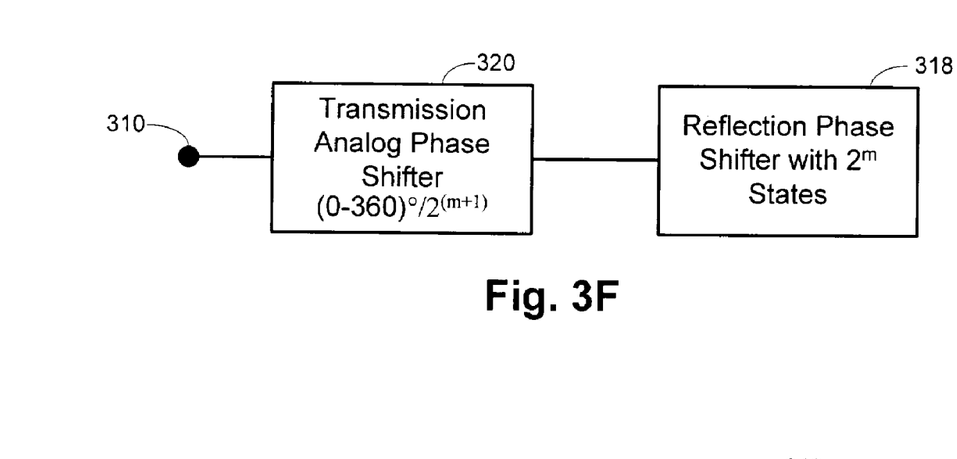
FIGS. 3F and 3G provide schematic illustrations of hybrid reflection phase shifters using combined analog and digital phase-shift elements.

For applications that use relatively fine phase control, i.e. with about 4–8 phase bits, a hybrid reflection phase shifter may be used. An example of such a phase shifter is illustrated with FIGS. 3D and 3E, with FIG. 3D providing a generic block diagram of the phase-shifter structure and FIG. 3E showing a specific example in one embodiment. A cascade of small transmission phase bits 316 are placed between the rf port 310 and the reflection phase shifter 318, with the reflection phase shifter being used to create the large phase steps. The reflection phase shifter 318 could be configured as a series or parallel reflection phase shifter as described in connection with FIGS. 3B and 3C respectively. For such large phase steps, a reflection phase shifter 318 may generally be provided with less cost and less complexity than a corresponding transmission phase shifter. The reflection phase shifters may be configured with one less switch than the number of phase states created, so that a sixteen-state phase shifter, equivalent to a four-bit phase shifter, would use fifteen switches. To create more phase states results in an increased number of switches, thereby increasing insertion loss, complexity, and cost. Transmission phase shifters providing small amounts of phase shift can be very simple and have low loss. The configuration shown generically in FIG. 3D thus effectively combines these benefits. This generic configuration may provide n bits of equivalent phase shift with transmission phase bits 316 varying from $360°/2^{(m+2)}$, $360°/2^{(m+3)}$, . . . , $360°/2^{(n+1)}$ and a reflection phase shifter with $2^m$ states. If each transmission phase bit 316 uses only one switching device, the total number of switching devices is $2^m-1+n-m$.

This is illustrated in FIG. 3E for the specific case where n=6 bits of equivalent phase shift are provided and with m=3. Thus, three transmission phase bits 316 provide 11.25°, 5.625°, and 2.812° phase shifts, which may be combined depending on the states of respective switches (and which are ultimately doubled because of the overall reflective character of the hybrid arrangement). The reflection phase shifter 318 is illustrated as a series reflection phase shifter with $2^m=8$ states. The total number of switches thus used is $2^3-1+6-3=10$. This hybrid reflection phase shifter thus provides an effective combination of transmission phase bits and reflection phase bits for applications requiring precise phase control.

Figure 3G:
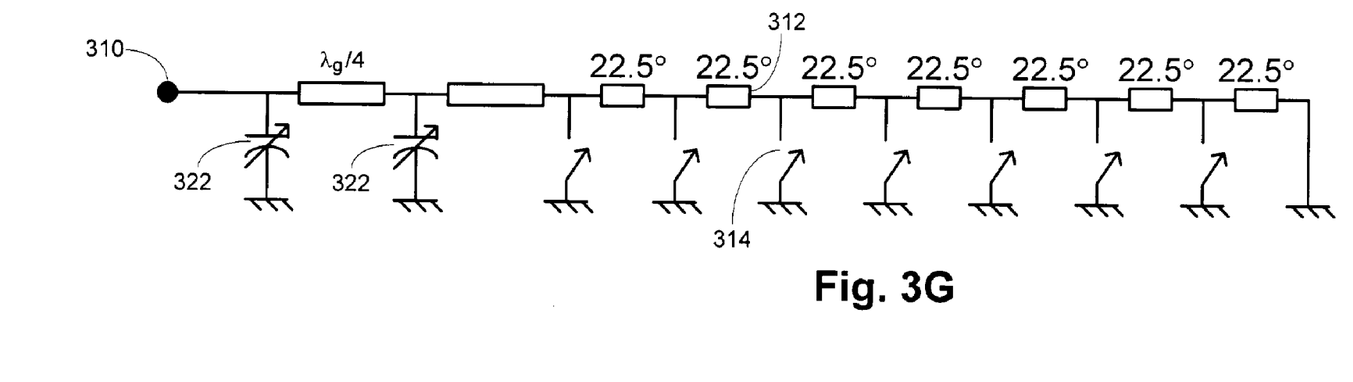

While the above description of phase shifters has focused on digital phase shifters, other embodiments of the invention may use analog phase shifters. In a particular embodiment, a hybrid reflection phase shifter is provided using combined analog and digital phase elements. Such an embodiment is illustrated with FIGS. 3F and 3G, with FIG. 3F providing a generic block diagram of the phase-shifter structure and FIG. 3G showing a specific example. This hybrid arrangement is similar to the hybrid arrangement shown in FIGS. 3E and 3F, except that the digital transmission phase shifters have been replaced with transmission analog phase shifter 320. The transmission analog phase shifter 320 may select varying phase shifts in the range $(0-360°)/2^{(m+1)}$, with the reflection phase shifter 318 again being provided with $2^m$ states. In the specific example shown in FIG. 3G for m=3, the reflection phase shifter 318 is shown as a series reflection phase shifter and the transmission analog phase shifter 320 is implemented using a (0–22.5°) variable capacitor 322, which may be a varactor-type control device.

An exemplary manufacturing process for the modules shown in FIGS. 2A and 2B is described in connection with FIG. 4. This description is made specifically in the context of an LTCC process, although the various steps in the process may be performed using other processing techniques in other embodiments. For instance, in some embodiments, a high-temperature co-fired ceramic ("HTCC") process may be used, while in other embodiments combinations of chemical or physical deposition and etching processes may be used. Examples of chemical deposition processes include chemical vapor deposition ("CVD") processes, which may encompass thermal CVD processes such as sub-atmospheric CVD ("SACVD") or low-pressure CVD ("LPCVD"); plasma-based CVD processes such as plasma-enhanced CVD ("PECVD") or high-density-plasma CVD ("HDP-CVD") processes; electrodeposition processes; and epitaxy processes such as vapor-phase epitaxy ("VPE"). Examples of physical deposition processes include physical vapor deposition ("PVD"), including evaporation- and sputtering-based processes, and casting techniques. Examples of etching processes that may be used in combination with the deposition processes to produce the structures described include wet etching techniques as well as dry etching techniques, including reactive ion etching ("RIE") or deep reactive ion etching ("DRIE"), sputter etching, and vapor-phase etching; in some instances, it may be desirable to adapt isotropic or anisotropic techniques in producing the described structures.

In most such techniques, it is usually convenient to produce the layered structure in an inverted fashion, i.e. by beginning with the structures shown on top of the antenna module element 104 in FIG. 2A, and building the inverted module element 104 progressively with the lower structures. Thus, as indicated at block 404 of FIG. 4, the exemplary manufacturing process may begin by disposing the radiating elements 120 over a first surface of the first dielectric layer. In instances where an LTCC process is used, the first dielectric layer may correspond to one or more lengths of ceramic tape, such as the commonly used Green Tape™ products available commercially from Dupont®. Such tape is formed from a ceramic tape that is mixed with a binder. For example, Dupont's Green Tape™ 951 has materials properties suitable for the manufacture of the module element 104. In the structure shown in FIG. 2A for the module element 104, the first dielectric layer 204 consists of two such layers of ceramic tape, although more generally any number of layers may be used to produce an appropriate thickness.

At block 408, a metallized ground plane is formed over the second surface of the first dielectric layer. In the LTCC process, such a metallized ground plane may be formed by screen printing with a metallic paste. The metallized ground plane is formed with one or more slots, as indicated at block 412, which may be formed inherently as part of the screen printing process; in other embodiments, the metallized ground plane could be provided initially as a continuous layer, with the slots subsequently etched by removing some of the ground-plane material as a separate step. In some instances, photolithographic processes may be used to produce the ground plane with the slot.

A second dielectric layer is subsequently disposed over the metallized ground plane at block 416 and a gap formed in the second dielectric layer at block 420. The second dielectric layer may be provided with further lengths of ceramic tape, which may be sized according to the dimensions of the module element 104 and according to the dimensions of one or more MEMS phase-shifter elements that are subsequently to be positioned within the gaps.

One or more metallized rf matching lines are formed over the second dielectric layer at block 428, such as by using the screen printing and/or photolithographic processes mentioned above. The rf matching lines are typically dimensioned and positioned with respect to the slots according to the criteria specified above for achieving low-loss rf coupling between the MEMS phase-shifter elements and the radiating elements in the completed module 104. Use of the photolithographic processes may aid in ensuring precise placement of the rf matching lines. Similarly, at block 432 one or more metallized dc bias lines are formed over the second dielectric layer, such as with the screen printing and/or photolithographic processes. In those embodiments where the dc bias lines and the rf matching lines are formed on the same layer, as in the embodiment shown in FIG. 2A, they may be formed as part of an integrated metallization process using photolithographic techniques to ensure their correct relative sizing and positioning.

The dc bias lines are to be used in coupling dc energy between the phase-shifter element and an electrical connection element disposed exterior to the completed module. Thus, at block 436, a third dielectric layer is formed over the metallized dc bias line. This dielectric layer may be formed at a perimeter of the module 104, as shown in FIG. 2A, so that only portions of the dc bias lines, and not of the rf matching lines, are covered by the third dielectric layer. Furthermore, it is advantageous for the third dielectric layer to be sufficiently thick that a cavity 225 internal to the module 104 may be formed. This is achieved in the LTCC process by building up the third dielectric layer from a plurality of lengths of ceramic tape. In the example shown in FIG. 2A, three lengths of ceramic tape are used to define the third dielectric layer, with the last of these being somewhat shorter than the others to accommodate formation of a recessed cover. Metallized vias are formed in the third dielectric layer at block 440; in embodiments that use an LTCC process, the metallized vias formed at block 440 may be formed by initially forming empty vias by punching, laser drilling, or equivalent technique. The empty vias may then be filled with a metallic paste by thick-film screen printing or by extrusion filling, which is generally capable of accommodating more narrow vias.

The partially completed module may be sintered at block 448 at an elevated temperature to remove the binder from the ceramic tape, to harden the metallic paste used in forming the dc bias lines, rf matching lines, and vias, and to fix the dielectric or electrically conductive properties of the various component layers. In an LTCC process, the sintering may be performed at a temperature less than 1000° C., although it may be performed at a higher temperature in an HTCC process. Usually the sintering is performed with a specific co-firing profile. For example, a typical profile may include a slow rising temperature of about 2–5° C. per minute up to a temperature of about 450° C., with a dwell time of about 1–2 hours to allow the removal of the binder through organic burnout. A subsequent temperature rise to about 850–875°

C. with a dwell time of about 10–15 minutes is used to complete the sintering. Also, in some embodiments, the ceramic tapes may be laminated during the process outlined in connection with FIG. 4. Such lamination may comprise uniaxial lamination in which tapes are pressed between heated platens, or may comprise isostatic pressing in which stacked tapes are packaged in a foil and pressed in hot water.

At block 452, the phase-shifter elements 220 are positioned within the gaps formed in the second dielectric layer at block 420. Such positioning may include the formation of wire bonds 236 to couple the phase-shifter elements 220 electrically with the rf matching lines 218 and dc bias lines 217. The phase-shifter elements are sealed within an interior of the module at block 456. In some instances, the seal may be hermetic. In embodiments where a perimeter third dielectric layer defines a cavity within the module, this may conveniently be accomplished by affixing a cover to a recessed portion of the third dielectric layer. As previously noted, such a cover may then act to protect the MEMS phase-shifter elements even in space or other inhospitable environments. At block 460, the module operation may be tested to ensure correct functioning, with the external electrical connections with the metallized vias being formed at block 464 in the form of a BGA.

Figure 4:
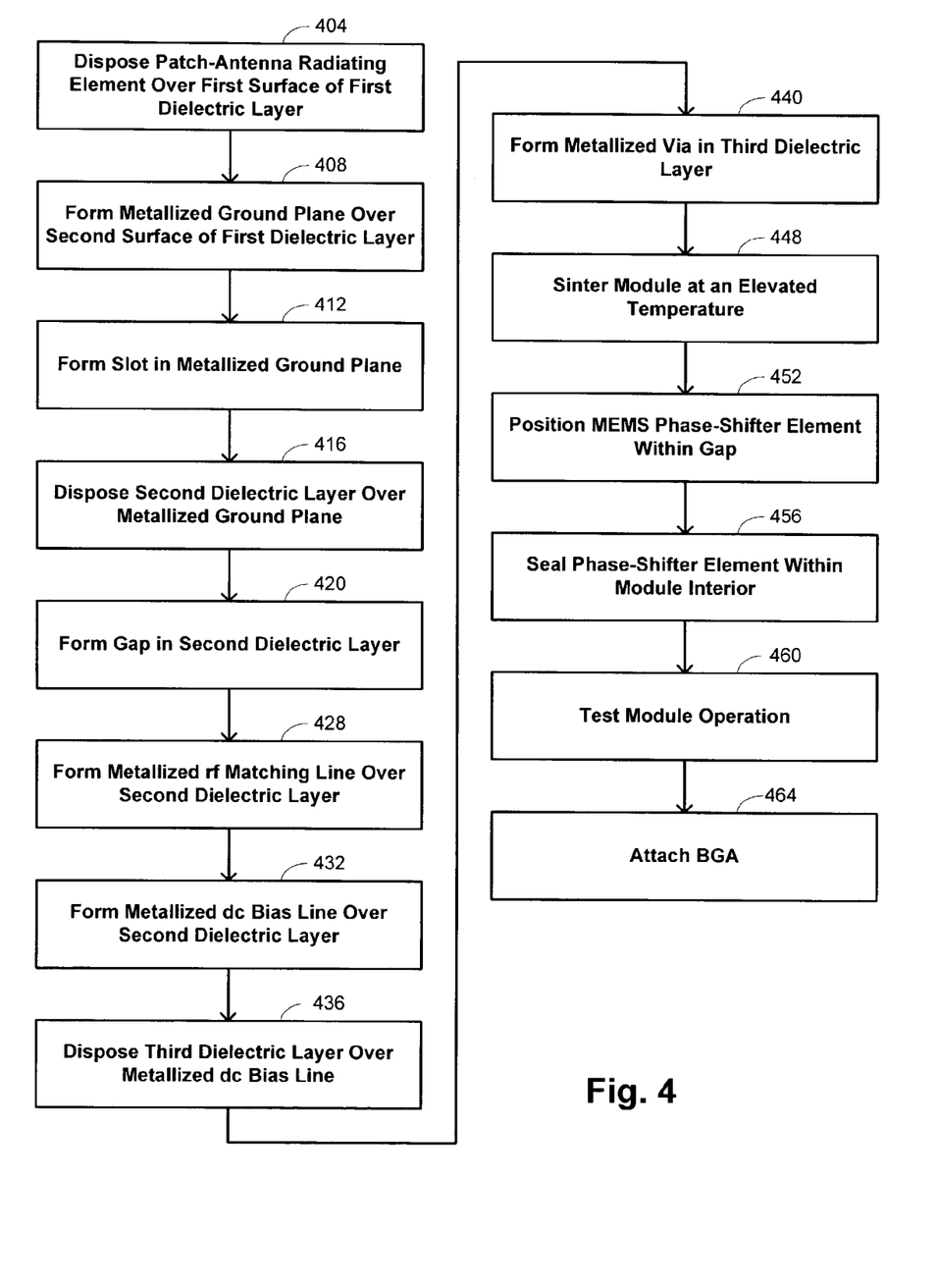
FIG. 4 provides a flow diagram illustrating a method for manufacturing a module in accordance with an embodiment of the invention.

As noted in some specific instances in the description of the flow diagram of FIG. 4, the order of the blocks may be varied in different embodiments, the functions of some of the blocks may be combined as integrated steps, some of the blocks may be omitted, and other supplementary steps may be performed. The specific order of the blocks is provided to illustrate a particular embodiment, but other embodiments may result from any of the various types of potential variants mentioned. Furthermore, while the description made in connection with FIG. 4 refers generally to the formation of a module such as shown in FIG. 2A, a module 104' like that shown in FIG. 2B may alternatively be formed. Such formation includes forming an additional driver patch within the first dielectric layer, such as by forming it on an opposite side of a first length of tape comprised by the first dielectric layer from a parasitic patch. In addition, metallized vias 248 may be formed through the second dielectric layer and a second length of tape comprised by the first dielectric layer using the same techniques described above for forming metallized vias 224.

A manufacturing process for an antenna having the structure shown in FIG. 1A may comprise manufacturing a plurality of the modules in the manner described in connection with FIG. 4. These modules may then be mounted to the back plane 108 of the antenna using a solder BGA or other structure formed to provide the external electrical connections of the modules. The reflectarray characteristics of the resulting antenna may then be provided by individually controlling the operation of each phase-shifter elements across the modules with the respective dc bias coupling structures.

Figure 5:
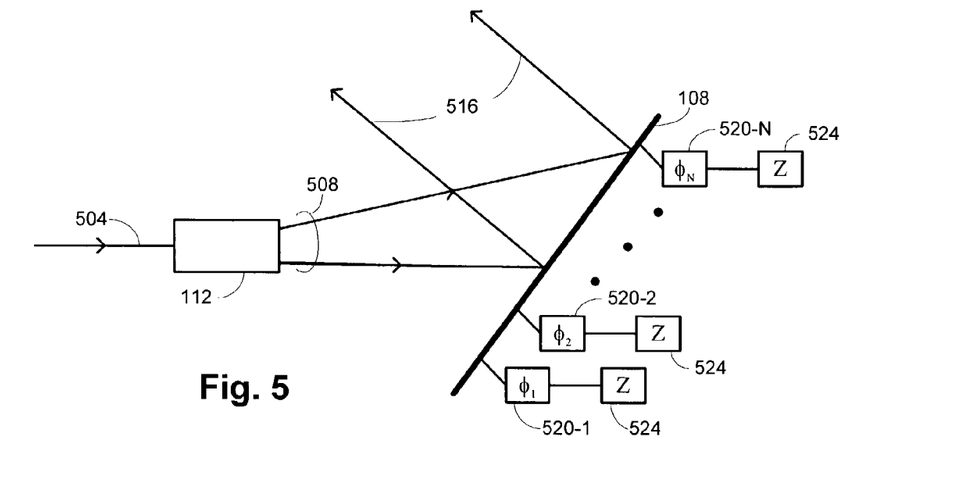
FIG. 5 provides a schematic illustration of beam steering using reflective phase shifters.

An illustration of how such a reflectarray capability may be implemented is illustrated with the schematic drawing of FIG. 5. The equivalent structure provided by the plurality of modules is illustrated in FIG. 5 with a plurality of phase-shifter elements 520 coupled with the back plane 108, and terminated in a purely reactance load 524. It is noted that while FIG. 5 illustrates the structure with a flat back plane, this is not required and other embodiments may alternatively use a non-flat surface. For example, use of such a non-flat surface may be desired to reduce structural scattering from the reflectarray or to conform to a particular structure. Each phase-shifter element 520-$i$ may be defined to have a different phase shift $\phi_i$, which is then applied to an electromagnetic beam 508 illuminated on the antenna with the feed antenna 112 in response to signal 504. In a typical embodiment, the radiating elements reflect the respective received portion of the beam 508 by re-radiating the received rf energy delayed by twice the phase $\phi_i$ of the corresponding phase-shifter element plus the reflection coefficient angle of its load. The character of the resulting reflected beam 516 may thus be controlled in accordance with the effective electrical shape of the reflector provided by the phase shifters. If all the phases are set to the same delay, i.e. $\phi_i = \phi$, then the reflector acts simply as a planar reflector. If, however, the phase shift $\phi_i$ is set to increase from the edges of the reflector to its center, then the reflector may mimic the behavior of a physically parabolically shaped reflector. In some instances, a linear taper may be added to the paraboloidal taper to steer the beam. Essentially any physical reflector shape may be mimicked through appropriate definition of the phase delays $\phi_i$.

Figure 6:
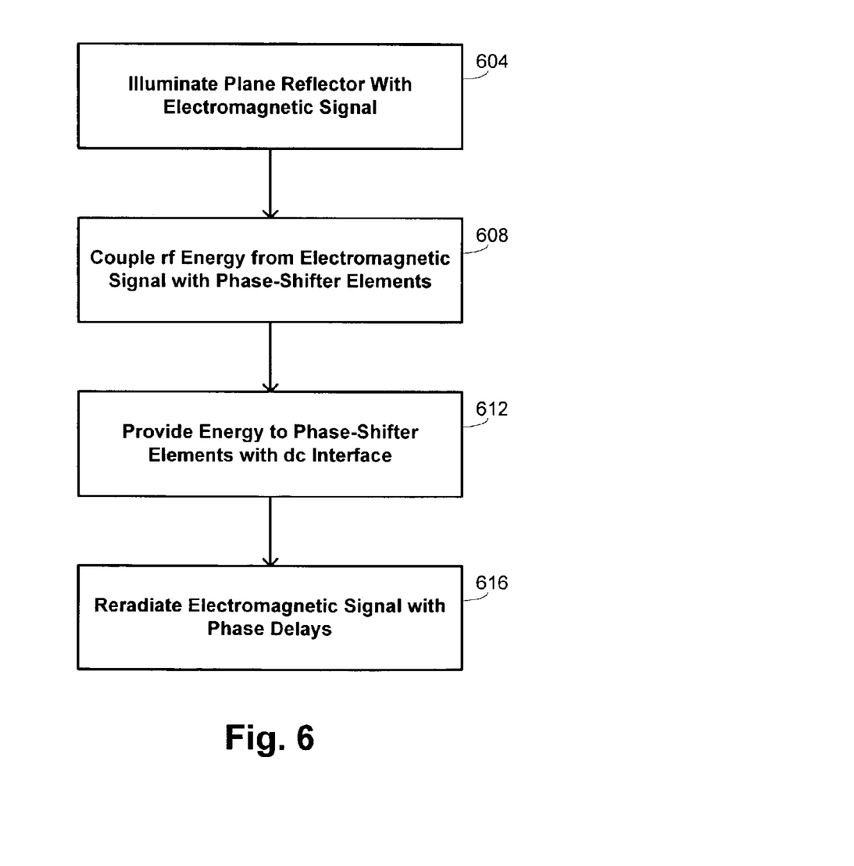
FIG. 6 provides a flow diagram illustrating a method for steering an electromagnetic signal in an embodiment of the invention.

This technique is summarized with the flow diagram provided in FIG. 6, which shows how the technique may be implemented using the structure of the antenna module elements described above. Thus, at block 604, a plane reflector is illuminated with an electromagnetic signal. The rf energy from the electromagnetic signal received at each of the radiating elements is coupled at block 608 with a phase-shifter element internal to a corresponding antenna module element. Energy is provided to the phase-shifter element using only a dc interface external to the module at block 612, thereby defining the phase shift $\phi_i$ to be applied by that phase-shifter element. At block 616, the radiating elements re-radiate the received portion of the electromagnetic signal with a phase delay defined by the corresponding phase-shifter element, thereby defining the characteristics of the steered electromagnetic signal.

Analysis performed by the inventors indicates that a total reflection loss less than 1.5 dB can be achieved even with scan angles greater than ±60°. This makes the methods and apparatus of the invention suitable for a large range of applications, including in particular applications involving both low earth orbit and deep space satellites. The reflectarray antenna provided in embodiments of the invention achieves improved antenna performance, with lower recurring cost, mass, and dc power, as well as ease of packaging, stowage and deployment, and ease of scalability to higher antenna radiated power. Furthermore, the use of reflectarray antennas permits rapid beamsteering and improved reliability. The time taken to move a beam is limited by the time taken to reset the switching devices, which may be on the order of μs, and not by the inertia of the reflector. For mechanically moveable reflectors, a gimbal mechanism is a potential single-point failure; in contrast, for a phase array such as described herein, a modest percentage of the elements may fail with only a small impact on array performance. Thus, these embodiments described herein permit production of a reliable, low-cost, vibration-free steered-beam antenna. The reflectarray antenna in these embodiments is, moreover, suitable for use in spacecraft-formation-flying applications, deep-space-communications applications, and medium and geostationary earth-orbit communications applications, among others.

Having described several embodiments, it will be recognized by those of skill in the art that various modifications, alternative constructions, and equivalents may be used without departing from the spirit of the invention. Accordingly, the above description should not be taken as limiting the scope of the invention, which is defined in the following claims.

What is claimed is:

1. A module comprising:
  a phase-shifter element disposed within an interior of the module;
  a radiating element;
  a metallized ground plane disposed within the interior of the module between the radiating element and the phase-shifter element;
  a radio-frequency ("rf") interface adapted to couple energy between the phase-shifter element and the radiating element, wherein the rf interface is disposed entirely within the interior of the module and is adapted to provide an rf interface with the module substantially only through the radiating element; and
  a direct-current ("dc") interface adapted to couple energy between the phase-shifter element and an electrical connection element disposed exterior to the module.

2. The module recited in claim 1 wherein:
  the phase-shifter element comprises a plurality of phase-shifter elements that define a device plane; and
  the radiating element comprises an array of radiating elements positioned to interact with an electromagnetic beam propagating substantially orthogonally to the device plane.

3. The module recited in claim 1 wherein the phase-shifter element comprises a microelectromechanical-systems ("MEMS") phase-shifter element.

4. The module recited in claim 1 wherein the phase-shifter element comprises a series reflection phase-shifter element.

5. The module recited in claim 1 wherein the phase-shifter element comprises a parallel reflection phase-shifter element.

6. The module recited in claim 1 wherein the phase-shifter element comprises a transmission phase-shifter element serially coupled with a reflection phase-shifter element.

7. The module recited in claim 6 wherein the transmission phase-shifter element comprises an analog transmission phase-shifter element.

8. The module recited in claim 6 wherein the transmission phase-shifter element comprises a digital transmission phase-shifter element.

9. The module recited in claim 1 further comprising a cover disposed to seal a cavity within the interior of the module in which the phase-shifter element is disposed.

10. The module recited in claim 1 wherein the rf interface comprises:
  a metallized rf matching line electrically coupled with the phase-shifter element; and
  a coupling slot in the metallized ground plane through which energy may be coupled with the radiating element.

11. The module recited in claim 10 wherein the metallized rf matching line extends a length beyond the coupling slot substantially equal to µg/4, wherein µg is a guide wavelength of the metallized rf matching line.

12. The module recited in claim 10 further comprising:
  a first dielectric layer disposed between the radiating element and the ground; and
  a second dielectric layer disposed between the ground plane and the metallized rf matching line.

13. The module recited in claim 1 wherein the rf interface comprises:
  a metallized rf transmission line electrically coupled with the phase-shifter element; and
  a metallized via disposed to provide a metallic connection through the metallized ground plane between the metallized rf transmission line and the radiating element.

14. The module recited in claim 13 wherein the radiating element is selected from the group consisting of a helix radiating element and a dipole radiating element.

15. The module recited in claim 1 further comprising a ball grid array coupled with the dc interface and adapted to electrically couple the module with an external element using only dc energy thereby eliminating any hardwired rf connection.

16. The module recited in claim 15 wherein the dc interface comprises:
  a metallized dc bias line electrically coupled with the phase-shifter element; and
  a metallized via stack through a dielectric stack within the interior of the module connecting the metallized dc bias line with a ball of the ball grid array.

17. The module recited in claim 1 wherein the radiating element comprises a patch-antenna radiating element.

18. The module recited in claim 1 wherein the radiating element comprises a stacked-patch-antenna radiating element.

19. The module recited in claim 1 wherein the radiating element comprises a slot radiating element.

20. A method for manufacturing a module for a reflectarray antenna, the method comprising:
  disposing a radiating element over a first surface of a first dielectric layer;
  forming a metallized ground plane over a second surface of the first dielectric layer;
  disposing a phase-shifter element over the metallized ground plane;
  forming a radio-frequency ("rf") interface adapted to couple energy between the phase-shifter element and the radiating element and to provide an rf interface with the module substantially only through the radiating element;
  forming a direct-current ("dc") interface adapted to couple energy between the phase-shifter element and an exterior to the module; and
  sealing the phase-shifter element within an interior of the module.

21. The method recited in claim 20 wherein:
  disposing the phase-shifter element over the metallized ground plane comprises disposing a plurality of MEMS phase-shifter elements to define a device plane; and
  disposing the radiating element over the first surface of the first dielectric layer comprises disposing an array of radiating elements over the first surface of the first dielectric layer positioned to interact with an electromagnetic beam propagating substantially orthogonally to the device plane.

22. The method recited in claim 20 wherein the phase-shifter element comprises a microelectromechanical-systems ("MEMS") phase-shifter element.

23. The method recited in claim 22 wherein disposing the MEMS phase-shifter element comprises:
  disposing a second dielectric layer over the metallized ground plane, the second dielectric layer having a gap; and
  positioning the MEMS phase-shifter element within the gap.

24. The method recited in claim 23 wherein forming the rf interface comprises:
  forming a coupling slot in the metallized ground plane;

forming a metallized rf matching line over a surface of the second dielectric layer opposite the metallized ground plane both electrically coupled with the MEMS phase-shifter element and electromagnetically coupled with the radiating element through the coupling slot.

25. The method recited in claim 23 wherein forming the rf interface comprises:

forming a metallized rf transmission line over a surface of the second dielectric layer opposite the metallized ground plane and electrically coupled with the MEMS phase-shifter element; and forming a metallized via to provide a metallic connection through the metallized ground plane between the metallized rf transmission line and the radiating element.

26. The method recited in claim 23 wherein forming the dc interface comprises:

forming a metallized dc bias line over a surface of the second dielectric layer opposite the metallized ground plane and electrically coupled with the MEMS phase-shifter element;

disposing a third dielectric layer comprising a metallized via over the metallized dc bias line; and forming an electrical connection to the metallized via over the third dielectric layer exterior to the module.

27. The method recited in claim 26 wherein each of the dielectric layers comprises powdered ceramic mixed with a binder, the method further comprising sintering the module to remove the binder.

* * * * *

UNITED STATES PATENT AND TRADEMARK OFFICE
CERTIFICATE OF CORRECTION

| | | |
|---|---|---|
| PATENT NO. | : 7,030,824 B1 | Page 1 of 1 |
| APPLICATION NO. | : 10/448265 | |
| DATED | : April 18, 2006 | |
| INVENTOR(S) | : William Joseph Taft et al. | |

It is certified that error appears in the above-identified patent and that said Letters Patent is hereby corrected as shown below:

TITLE PAGE

Under Item (57) Abstract, line 2 "segregated de" should read --segregated dc--.

COLUMN 15

Line 57, "µg/4" should read --$\lambda$g/4--; and

Line 57, "µg" should read --$\lambda$g--.

Signed and Sealed this

Seventeenth Day of October, 2006

JON W. DUDAS
*Director of the United States Patent and Trademark Office*